(12) United States Patent
Hsu et al.

(10) Patent No.: US 11,929,730 B2
(45) Date of Patent: Mar. 12, 2024

(54) ACOUSTIC WAVE DEVICE AND FORMING METHOD THEREOF

(71) Applicant: EPISTAR CORPORATION, Hsinchu (TW)

(72) Inventors: Ta-Cheng Hsu, Hsinchu (TW); Wei-Shou Chen, Hsinchu (TW); Chun-Yi Lin, Hsinchu (TW); Chung-Jen Chung, Hsinchu (TW); Wei-Tsuen Ye, Hsinchu (TW); Wei-Ching Guo, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 347 days.

(21) Appl. No.: 17/172,568

(22) Filed: Feb. 10, 2021

(65) Prior Publication Data
US 2021/0257986 A1  Aug. 19, 2021

(30) Foreign Application Priority Data
Feb. 14, 2020  (TW) .................. 109104675

(51) Int. Cl.
| H03H 9/13 | (2006.01) |
| H03H 3/02 | (2006.01) |
| H03H 9/17 | (2006.01) |
| H10N 30/076 | (2023.01) |
| H10N 30/87 | (2023.01) |

(52) U.S. Cl.
CPC .............. *H03H 9/131* (2013.01); *H03H 3/02* (2013.01); *H03H 9/173* (2013.01); *H10N 30/076* (2023.02); *H10N 30/877* (2023.02); *H03H 2003/021* (2013.01)

(58) Field of Classification Search
CPC ....... H03H 9/131; H03H 9/173; H10N 30/877
See application file for complete search history.

(56) References Cited

U.S. PATENT DOCUMENTS

| 2005/0093397 | A1 | 5/2005 | Yamada et al. | |
| 2005/0140743 | A1 | 6/2005 | Miyazawa et al. | |
| 2008/0024041 | A1* | 1/2008 | Shibata .................. | H03H 9/105 29/25.35 |
| 2011/0237204 | A1* | 9/2011 | Jamneala ............... | H03H 9/584 455/73 |
| 2013/0049545 | A1* | 2/2013 | Zou .......................... | H03H 3/04 310/346 |
| 2015/0280100 | A1 | 10/2015 | Burak et al. | |

(Continued)

*Primary Examiner* — Bryan P Gordon
(74) *Attorney, Agent, or Firm* — Patterson + Sheridan, LLP

(57) ABSTRACT

An acoustic wave element includes: a substrate; a bonding structure on the substrate; a support layer on the bonding structure; a first electrode including a lower surface on the support layer; a cavity positioned between the support layer and the first electrode and exposing a lower surface of the first electrode; a piezoelectric layer on the first electrode; and a second electrode on the piezoelectric layer, wherein at least one of the first electrode and the second electrode includes a first layer and a second layer that the first layer has a first acoustic impedance and a first electrical impedance, the second layer has a second acoustic impedance and a second electrical impedance, wherein the first acoustic impedance is higher than the second acoustic impedance, and the second electrical impedance is lower than the first electrical impedance.

8 Claims, 4 Drawing Sheets

(56) References Cited

U.S. PATENT DOCUMENTS

| | | | |
|---|---|---|---|
| 2017/0294543 A1* | 10/2017 | Yamazaki | H01L 27/1229 |
| 2018/0183406 A1* | 6/2018 | Patil | H03H 9/173 |
| 2018/0367113 A1 | 12/2018 | Shealy et al. | |
| 2019/0158057 A1* | 5/2019 | Jeong | H03H 9/02118 |
| 2019/0199322 A1 | 6/2019 | Dasgupta et al. | |
| 2020/0204145 A1* | 6/2020 | Kyoung | H03H 9/173 |

\* cited by examiner

ACOUSTIC WAVE DEVICE AND FORMING METHOD THEREOF

RELATED APPLICATION DATA

This application claims the right of priority of TW Application No. 109104675, filed on Feb. 14, 2020, and the content of which is hereby incorporated by reference in its entirety.

TECHNICAL FIELD

The present application relates to an acoustic wave element and a forming method thereof, and more particularly, to an acoustic wave element having a cavity and a forming method thereof.

DESCRIPTION OF BACKGROUND ART

Wireless frequency communication devices (e.g., smartphones) rely on acoustic filters to filter out signals in adjacent frequency bands in order to operate properly in various radio frequencies and bands. In order to meet the requirements of communication apparatus which are getting increasingly complicated, it is necessary to use filters with different types and compositions of acoustic wave elements for different communication channels and communication devices to tune in different ranges of bandwidths.

As communication devices continue to evolve toward lighter, thinner, shorter, and more fashionable, and as frequency resources become more and more crowded, filters with high-performance acoustic wave elements are becoming more important. Although the existing acoustic wave elements and their formation methods have generally met the needs of filters and various communication devices, they are not yet satisfactory in all aspects.

SUMMARY OF THE APPLICATION

An acoustic wave element includes: a substrate; a bonding structure on the substrate; a support layer on the bonding structure; a first electrode including a lower surface on the support layer; a cavity positioned between the support layer and the first electrode and exposing the lower surface of the first electrode; a piezoelectric layer on the first electrode; and a second electrode on the piezoelectric layer, wherein at least one of the first electrode and the second electrode includes a first layer and a second layer that the first layer has a first acoustic impedance and a first electrical impedance, the second layer has a second acoustic impedance and a second electrical impedance, wherein the first acoustic impedance is higher than the second acoustic impedance, and the second electrical impedance is lower than the first electrical impedance.

A forming method of an acoustic wave element includes steps of providing a first substrate; forming a piezoelectric layer on the first substrate wherein the piezoelectric layer includes a first surface and a second surface opposite to the first surface; forming a first electrode including a lower surface on the first surface of the piezoelectric layer; forming a sacrificial layer including an upper surface and a side surface on the first electrode; forming a support layer which covers the upper surface and the side surface of the sacrificial layer; providing a second substrate; joining the support layer to the second substrate; removing the first substrate; and removing the sacrificial layer to form a cavity between the first electrode and the support layer and exposing the lower surface of the first electrode; wherein the first electrode includes a first layer and a second layer, the first layer has a first acoustic impedance and a first electrical impedance, the second layer has a second acoustic impedance and a second electrical impedance, wherein the first acoustic impedance is higher than the second acoustic impedance, and the second electrical impedance is lower than the first electrical impedance.

BRIEF DESCRIPTION OF THE DRAWINGS

The embodiments of the present application are described in detail below in conjunction with the attached drawings. It should be noted that, in accordance with standard practice in the industry, the various features are not drawn to scale and are used for illustrative purposes only. In fact, the size of the components can be enlarged or reduced at will to clearly represent the features of the embodiments of the present application.

DETAILED DESCRIPTION OF PREFERRED EMBODIMENTS

Figure 1A:
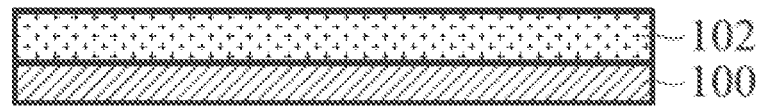
FIGS. 1A to 1B are schematic drawings of sections illustrating various intermediate stages in the process of forming an acoustic wave element according to some embodiments of the present application.

The following describes the acoustic wave element and its manufacturing method of an embodiment of the present application. However, it should be understood that embodiments of the present application provide many suitable inventive concepts that can be implemented in a wide variety of specific contexts. The particular embodiments disclosed are intended only to illustrate a particular method of making and using the invention and are not intended to limit the scope of the application. Further, the same symbols are used in the drawings and descriptions of the embodiments of the present application to indicate identical or similar parts.

Figure 1B:
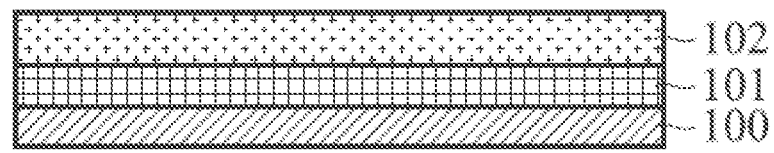
Figure 2:
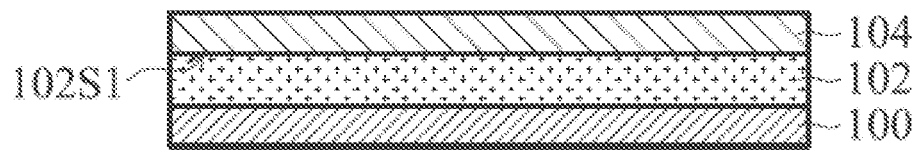
FIGS. 2 to 9 are schematic drawings illustrating the various intermediate stages in the process of forming an acoustic wave element according to some embodiments of the present application.
Figure 3:
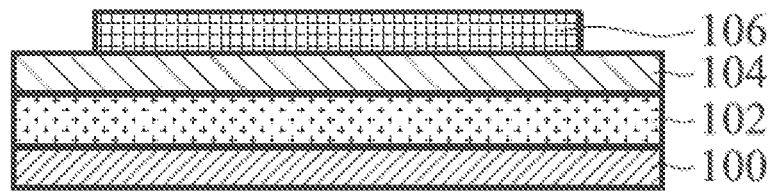

FIGS. 1A to 1B are schematic drawings of sections illustrating various intermediate stages in the process of forming an acoustic wave element according to some embodiments of the present application. Referring to FIG. 1A, a first substrate is provided, and the piezoelectric layer 102 is formed on top of the first substrate 100. In some embodiments, the first substrate 100 is an epitaxial substrate, and the material of which includes silicon, silicon carbide, sapphire, etc., or a combination thereof. In other embodiments, the first substrate 100 is a carrier substrate, and the material of which includes glass, metal, plastic, ceramic, etc., or a combination thereof. In other embodiments, the piezoelectric layer 102 is an epitaxial layer, which is fabricated by epitaxial processes such as metal organic CVD (MOCVD), molecular beam epitaxy (MBE), liquid phase epitaxy (LPE), vapor phase epitaxy (VPE), and vapor phase epitaxy (LPE), vapor phase epitaxy (VPE), similar processes, or a combination thereof. In other embodiments, the piezoelectric layer 102 is formed by pulsed laser deposition (PLD), sputtering deposition, etc., or a combination thereof. In some embodiments, the piezoelectric layer 102 is a monocrystalline layer. In other embodiments, the piezoelectric layer 102 is a polycrystalline layer. The material of the piezoelectric layer 102 includes aluminum nitride, zinc oxide, or lead zirconate titanate (PZT, also known as piezoelectric ceramics). The material of buffer layer 101 includes aluminum nitride, gallium nitride, or aluminum gallium nitride. In some embodiments, when the material of the first substrate 100 is sapphire, an additional laser lift-off (LLO) layer can be formed on the first substrate 100, followed by a buffer layer 101 on top of the LLO layer. If the energy level of the material of the LLO layer is lower than that of the laser light source and the energy level of the buffer layer 101 and/or the piezoelectric layer 102 is larger than that of the laser light source, the LLO layer can absorb the laser light and melt or crack when the laser light is irradiated from the side of the first substrate 100, so that the first substrate 100 and the LLO layer can be removed without affecting the buffer layer 101 and/or the piezoelectric layer 102. Removal of the first substrate 100 and LLO layer without affecting the buffer layer 101 and/or piezoelectric layer 102.

FIGS. 2 to 6 are schematic drawings illustrating the various intermediate stages in the process of forming an acoustic wave element according to some embodiments of the present application. Referring to the FIG. 2, the first electrode 104 is formed on the first surface 102S1 of the piezoelectric layer 102. The material of the first electrode 104 may include iridium, molybdenum, platinum, rubidium, tungsten, titanium tungsten alloy or a combination of the foregoing. Next, referring to FIG. 3, the sacrificial layer 106 is formed over a portion of the surface of the first electrode 104. The sacrificial layer 106 is removed in a subsequent step to form a cavity in the acoustic wave element. The material of the sacrificial layer 106 may include an inorganic material, an organic material, or a combination of the foregoing. For example, inorganic materials may include oxide of tetraethoxysilane (TEOS), amorphous silicon, phosphosilicate glass (PSG), silicon dioxide, polysilicon, or a combination of the foregoing. For example, organic materials may include photoresist. These materials may be deposited by chemical vapor deposition processes, atomic layer deposition processes, physical vapor deposition processes, rotational coating processes, one or more other processes, or combinations thereof. The material is deposited by chemical vapor deposition, atomic layer deposition, physical vapor deposition, rotational coating, one or more other processes or a combination thereof.

Figure 4:
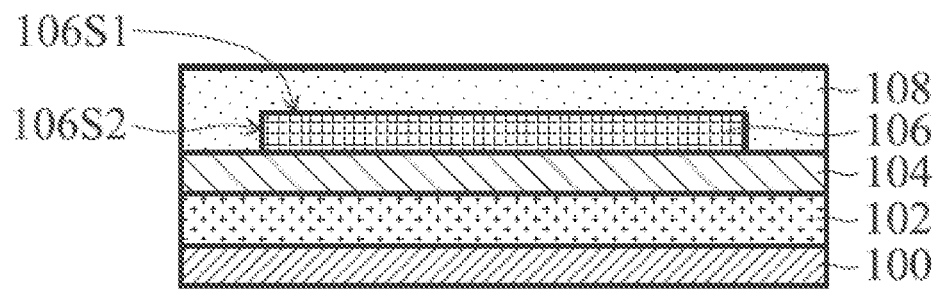

Next, with reference to FIG. 4, a support layer 108 is formed to cover the upper surface 106S1 and the side surfaces 106S2 of the sacrificial layer 106, and the material of the support layer 108 is selected from materials having different etching resistance than the sacrificial layer 106, such as polysilicon, silicon dioxide, or a combination thereof.

Figure 5:
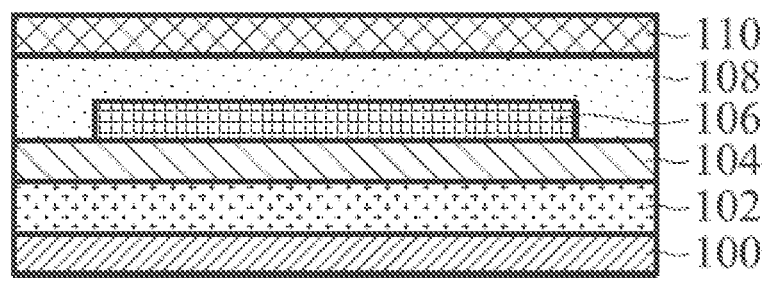
Figure 6:
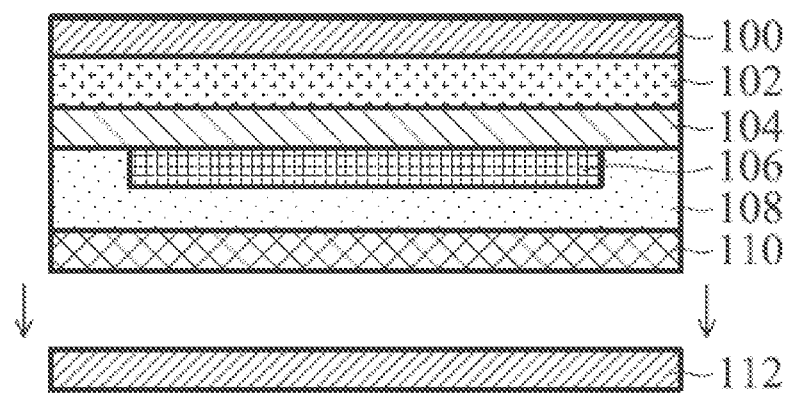

Then, referring FIGS. 5 and 6, after the step of forming the support layer 108, the structure of FIG. 5 is flipped and the support layer 108 is joined to the second substrate 112. The material of the second substrate 112 includes silicon, silicon carbide, sapphire, etc., or a combination thereof. In some embodiments, the support layer 108 is joined to the second substrate 112 with a bonding structure. In some embodiments, the bonding structure includes a bonding layer 110 formed on the support layer 108 and/or another bonding layer (not shown) on the second substrate 112. In other embodiments, the support layer 108 is directly joined to the second substrate 112 without the bonding structure. The material of the bonding structure includes an insulating material, a conductive material, or a combination thereof. For example, the insulating material includes silicon dioxide, aluminum oxide, bonding adhesive (e.g., epoxy resin, UV-curable adhesive), photoresist, or a combination thereof; the conductive material includes metallic material. Metallic material includes indium tin oxide (ITO), titanium, gold, indium, or a combination thereof.

Figure 7:
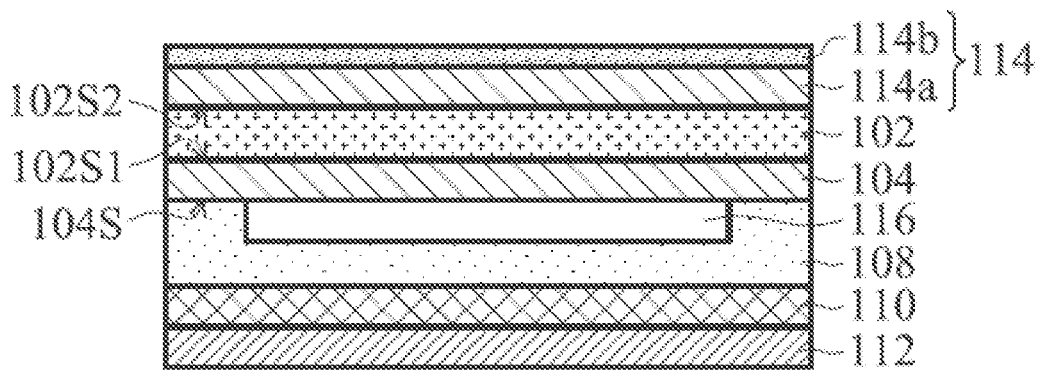

Referring to FIG. 7, according to some embodiments of the present application, the first substrate 100 shown in FIG. 6 is removed and a second electrode 114 is formed on the second surface 102S2 of the piezoelectric layer 102, and the second surface 102S2 of the piezoelectric layer 102 is the opposite of the first surface 102S1 of the piezoelectric layer 102. The material of the second electrode 114 includes iridium, molybdenum, platinum, ruthenium, tungsten, titanium tungsten alloy or a combination thereof. In some embodiments, since a buffer layer 101 is formed on the first substrate 100, the buffer layer 101 is removed after the first substrate 100 is removed, and the method of removing the first substrate 100 includes a laser lift-off, etching, or grinding process, and the method of removing the buffer layer 101 includes an etching or grinding process. In one embodiment, when the first substrate 100 is a sapphire, the LLO layer is modified by laser at first, such as melting or cracking. The bonding force between the first substrate 100 and the piezoelectric layer 102 becomes weaker due to the modified LLO layer, and then the first substrate 100 and the modified LLO layer are removed. The second electrode 114 is made of the same material as the first electrode 104 and will not be repeatedly described here. In the embodiment, when the piezoelectric layer 102 is a polycrystalline layer, the second electrode 114 is also formed on the first substrate 100 before the step of forming the piezoelectric layer 102.

Figure 8:
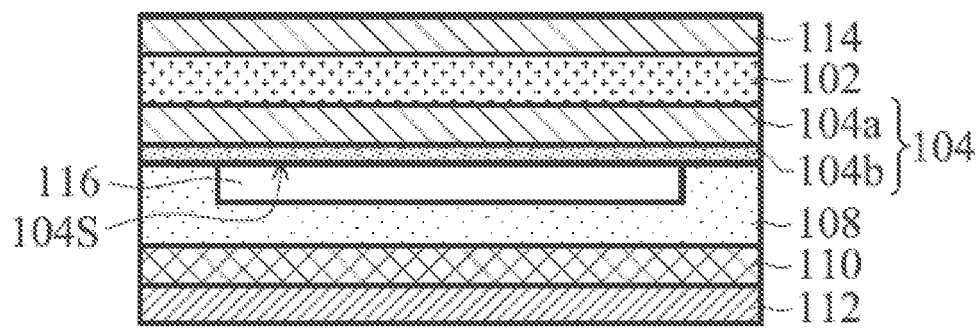
Figure 9:
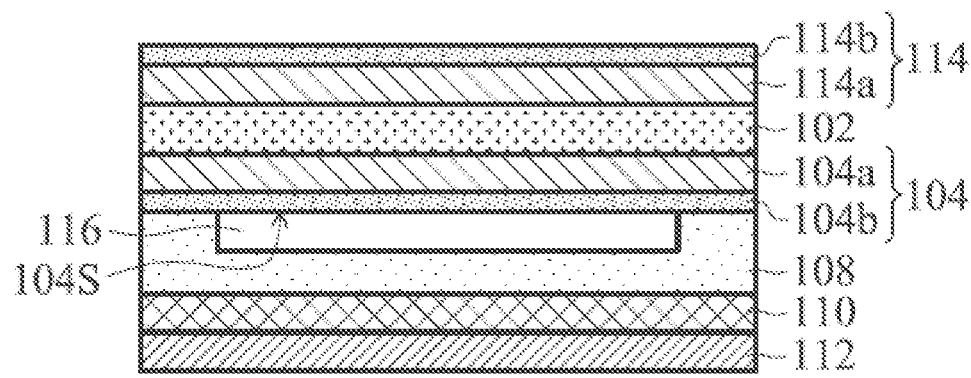

According to some embodiments of the present application, at least one of the first electrode 104 and the second electrode 114 is a composite electrode including a first layer and a second layer. The first has an acoustic impedance higher than that of the second layer while the second layer has an electrical impedance lower than that of the first layer. In some embodiments, as shown in FIG. 8, the first electrode 104 is a composite electrode including a first layer 104a and a second layer 104b, and the second electrode 114 is an electrode of a single layer. In some embodiments, as shown in FIG. 7, the first electrode 104 is an electrode of a single layer, and the second electrode 114 is a composite electrode including a first layer 114a and a second layer 114b. In some embodiments, as shown in FIG. 9, both the first electrode 104 and the second electrode 114 are composite electrodes, wherein each of the composite electrodes including a first layer 104a/114a and a second layer 104b/114b. According to any of the embodiments illustrated in FIGS. 7, 8, and 9, each of the first layers 104a/114a has a first acoustic impedance and a first electrical impedance, and each of the second layers 104b/114b has a second acoustic impedance and a second electrical impedance. The first acoustic impedance is higher than the second acoustic impedance and the second electrical impedance is lower than the first electrical impedance. The material of the first layer 104a/114a includes iridium, molybdenum, platinum, ruthenium, tungsten, titanium tungsten alloy or a combination thereof while the material of the second layer 104b/114b includes gold, silver, copper, aluminum or a combination thereof.

When only a single layer of metallic material with high acoustic impedance is a selected for the upper and lower electrodes of the acoustic wave element, the electrical impedance of the selected material is usually also high and affects the conductivity of the electrodes, which in turn affects the characteristics of the filter element. The acoustic wave element provided in the present application includes a composite electrode, which includes a layer of higher acoustic impedance adjacent to the piezoelectric layer and a layer of lower electrical impedance away from the piezoelectric layer. The layer of higher acoustic impedance effectively prevents the acoustic waves generated by the piezoelectric layer from spreading to the surrounding area while the layer of lower electrical impedance improves the overall electrical conductivity of the composite electrode, thereby enhancing the performance of the filter element.

Referring again to FIG. 7 through FIG. 9, after forming the second electrode 114, the sacrificial layer 106 is removed by a selective etching process to create the cavity 116 between the support layer 108 and the first electrode 104. The etching process in each embodiment includes dry etching, wet etching, and/or other suitable processes. For example, the dry etching processes such as plasma etching (PE), reactive ion etching (ME), inductively coupled plasma reactive ion etching (ICP-RIE) can use plasma, gas or a combination of the foregoing to be carried out. The gases include oxygen-containing gases, fluorine-containing gases (e.g., carbon tetrafluoride, sulfur hexafluoride, methane difluoride, fluoroform, and/or ethylene hexafluoride), chlorine-containing gases (e.g., chlorine, chloroform, carbon tetrachloride, and/or boron trichloride), bromine-containing gases (e.g., hydrogen bromide and/or bromoform), iodine-containing gases, other suitable gases, and/or combinations thereof. For example, the wet etching process is carried out with acidic or alkaline solutions, or other suitable wet etching chemicals. Acidic solutions include solutions of hydrofluoric acid, phosphoric acid, nitric acid, and/or acetic acid; alkaline solutions include solutions containing potassium hydroxide, ammonia, and/or hydrogen peroxide. After the sacrificial layer 106 is removed, the lower surface 104S of the first electrode 104 (as shown in FIG. 7) or the lower surface 104S of the second electrode layer 104b in the first electrode 104 as a composite electrode (as shown in FIGS. 8 and 9) is exposed in the cavity 116.

In the acoustic wave element provided by the embodiments of the present application, the lower surface of the first electrode (or the lower electrode) is directly exposed to the cavity, and there is no additional material/structure between the lower surface of the first electrode (or the lower electrode) and the cavity. Due to large difference between the acoustic impedance of the air in the cavity and the acoustic impedance of the single layer of the first electrode or the second layer of the first electrode is large, the acoustic waves generated by the piezoelectric layer between the electrodes can be effectively reflected from the interface between the single or the second layer of the first electrode and the cavity, thus enhancing the reflection efficiency and thus the performance of the filter element.

Figure 10A:
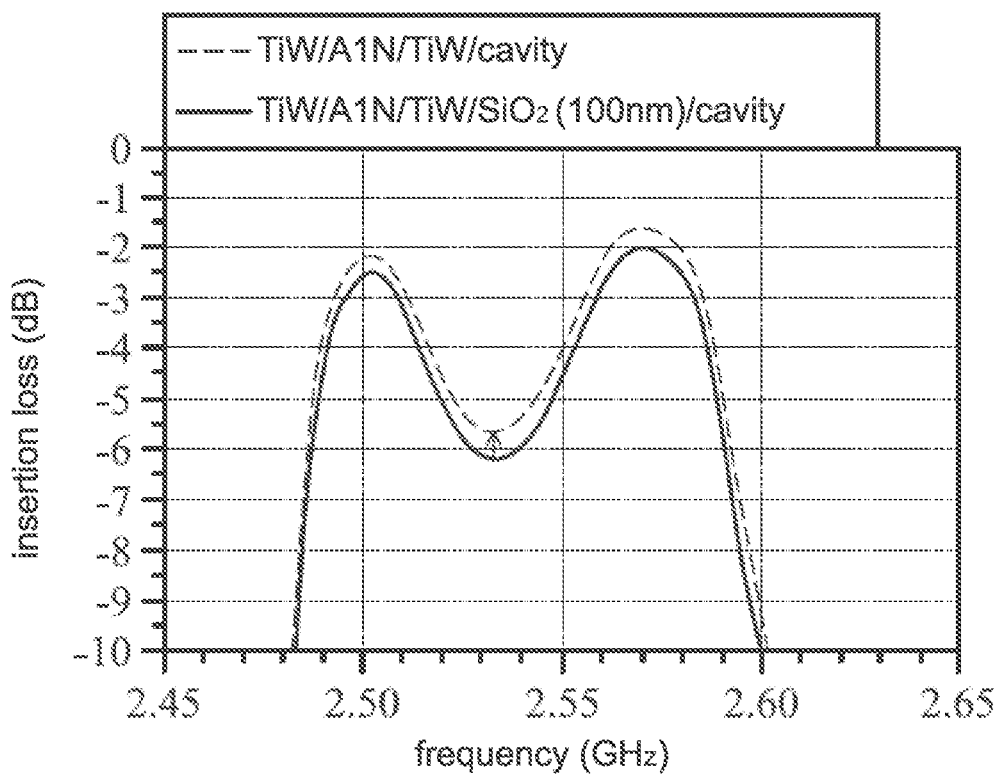
FIGS. 10A to 10B show the frequency response of a filter using the acoustic wave element of different embodiments of the present application.
Figure 10B:
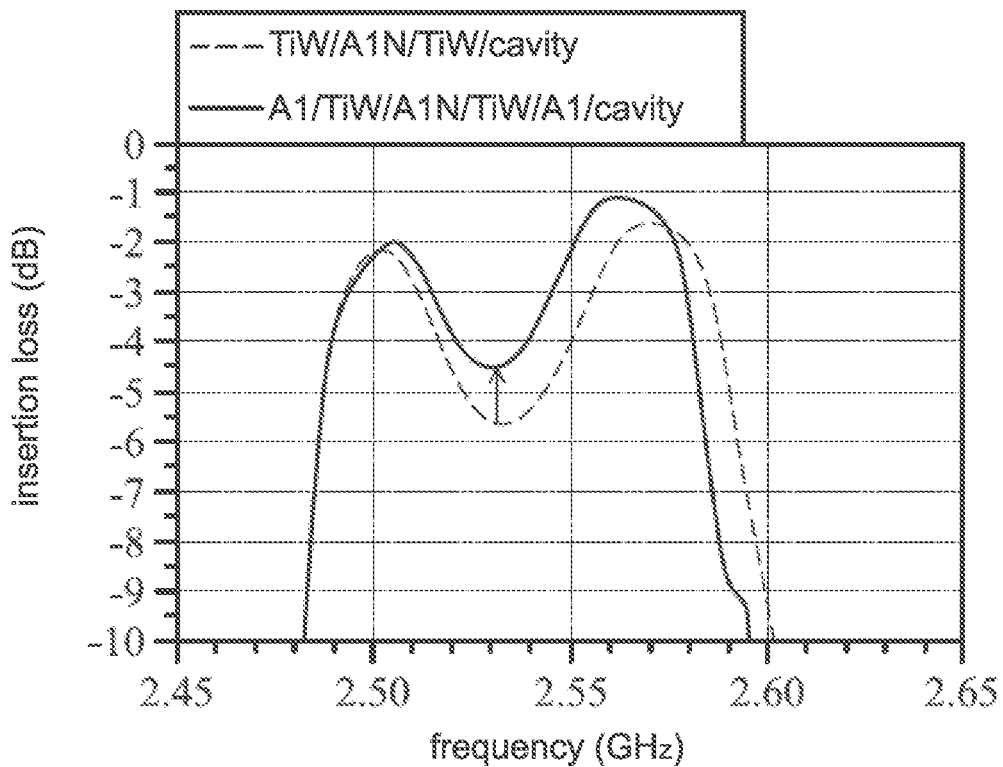

FIGS. 10A and 10B show the frequency response of a filter element using the acoustic wave element of different embodiments of the present application. Referring to FIG. 10A, the filter element having the lower electrode (or the first electrode) directly exposed to the cavity exhibits about 0.534 dB less insertion loss (marked by the arrow) at the center frequency of the passband than that of the filter element with a partial support layer (thickness of about 100 nm) between the lower electrode (or the first electrode) and the cavity (that is, the cavity is formed in the support layer). This indicates that the presence of other structures between the lower electrode and the cavity reduces the reflection efficiency, resulting in more insertion loss of the acoustic wave and thus the performance of the filter element.

Based on the above, the acoustic wave element provided by the embodiment of the present application uses a composite electrode with a multiple electrode layers, which includes an electrode layer of higher acoustic impedance and an electrode layer of lower electrical impedance, which not only effectively enhances efficiency of the acoustic wave resonance, but also improves the overall conductivity of the composite electrode. In addition, the lower surface of the lower electrode is directly exposed to the cavity so that the acoustic waves generated by the piezoelectric layer between the electrode layers can be effectively reflected from the interface between the electrode layers and the cavity, thus enhancing the reflection efficiency and thus the performance of the filter element (less insertion loss).

The foregoing outlines several parts of the embodiments so that those having ordinary knowledge in the art to which the invention belongs may more readily understand the point of view of the embodiments of the present application. Persons having ordinary knowledge in the art of the present application should understand that they can design or modify other processes and structures based on the embodiments of the present application to achieve the same purposes and/or advantages as the embodiments presented herein. Persons having ordinary knowledge in the art to which the present application belongs should also understand that such equivalent processes and structures are not inconsistent with the spirit and scope of the present application and that they are capable of making all kinds of changes, substitutions and replacements without being inconsistent with the spirit and scope of the present application.

What is claimed is:

1. An acoustic wave element, comprising:
   a substrate;
   a bonding structure on the substrate;
   a support layer on the bonding structure;
   a first electrode comprising a lower surface on the support layer,
   a cavity positioned between the support layer and the first electrode and exposing the lower surface of the first electrode;
   a piezoelectric layer on the first electrode; and
   a second electrode on the piezoelectric layer;
   wherein at least one of the first electrode and the second electrode comprises a first layer and a second layer that the first layer has a first acoustic impedance and a first electrical impedance, the second layer has a second acoustic impedance and a second electrical impedance, wherein the first acoustic impedance is higher than the second acoustic impedance and the second electrical impedance is lower than the first electrical impedance.

2. The acoustic wave element according to claim 1, wherein the piezoelectric layer is an epitaxial layer.

3. The acoustic wave element according to claim 1, wherein the piezoelectric layer is a polycrystalline layer.

4. The acoustic wave element according to claim 1, wherein the first layer is adjacent to the piezoelectric layer and the second electrode layer is remote from the piezoelectric layer.

5. The acoustic wave element according to claim 1, wherein the material of the first layer comprises iridium, molybdenum, platinum, rubidium, tungsten, titanium tungsten alloy, or a combination thereof.

6. The acoustic wave element according to claim 1, wherein the material of the second layer comprises gold, silver, copper, aluminum or the combination thereof.

7. The acoustic wave element according to claim 1, wherein each of the first electrode and the second electrode comprises the first layer and the second layer.

8. The acoustic wave element according to claim 1, wherein there is no additional material between the lower surface of the first electrode and the cavity.

\* \* \* \* \*